US008421658B1

(12) United States Patent
Yau et al.

(10) Patent No.: US 8,421,658 B1
(45) Date of Patent: Apr. 16, 2013

(54) PARALLEL PIPELINED CALCULATION OF TWO CALIBRATION VALUES DURING THE PRIOR CONVERSION CYCLE IN A SUCCESSIVE-APPROXIMATION-REGISTER ANALOG-TO-DIGITAL CONVERTER (SAR-ADC)

(75) Inventors: Hok Mo Yau, Hong Kong (HK); Tin Ho (Andy) Wu, Hong Kong (HK); Kam Chuen Wan, Hong Kong (HK); Yat To (William) Wong, Hong Kong (HK)

(73) Assignee: Hong Kong Applied Science & Technology Research Institute Company, Ltd., Hong Kong (HK)

( * ) Notice: Subject to any disclaimer, the term of this patent is extended or adjusted under 35 U.S.C. 154(b) by 39 days.

(21) Appl. No.: 13/304,346

(22) Filed: Nov. 24, 2011

(51) Int. Cl.
*H03M 1/10* (2006.01)
(52) U.S. Cl.
USPC ........... 341/120; 341/118; 341/121; 341/143; 341/155; 341/172
(58) Field of Classification Search .......... 341/118–121, 341/143, 155, 172
See application file for complete search history.

(56) References Cited

U.S. PATENT DOCUMENTS

| 4,399,426 | A | | 8/1983 | Tan | |
|---|---|---|---|---|---|
| 5,644,308 | A | * | 7/1997 | Kerth et al. | 341/120 |
| 5,684,487 | A | * | 11/1997 | Timko | 341/172 |
| 6,400,302 | B1 | * | 6/2002 | Amazeen et al. | 341/172 |
| 6,538,594 | B1 | * | 3/2003 | Somayajula | 341/172 |
| 6,707,403 | B1 | * | 3/2004 | Hurrell | 341/120 |
| 7,170,439 | B1 | * | 1/2007 | Chen | 341/172 |
| 7,378,999 | B1 | * | 5/2008 | McGrath et al. | 341/120 |
| 7,812,257 | B2 | * | 10/2010 | Gunderman et al. | 174/66 |
| 7,812,757 | B1 | | 10/2010 | Wong et al. | |
| 7,880,650 | B2 | * | 2/2011 | Feddeler et al. | 341/120 |
| 7,973,684 | B2 | * | 7/2011 | Nolan et al. | 341/118 |
| 2012/0001781 | A1 | * | 1/2012 | Scanlan | 341/110 |
| 2012/0212359 | A1 | * | 8/2012 | Lai et al. | 341/120 |

OTHER PUBLICATIONS

Lee, Hae-seung, et al., "A Self-calibrating 15 Bit CMOS A/D Converter", IEEE JSSC, vol. sc-19, No. 6, Dec. 1984, pp. 813-819.
Lee, Hae-seung, and Hodges, David, "Self-calibrating Technique for A/D Converters", IEEE Trans Cir. & Sys, vol. CAS-30, No. 3, Mar. 1983, pp. 188-190.

* cited by examiner

*Primary Examiner* — Linh Nguyen
(74) *Attorney, Agent, or Firm* — Stuart T. Auvinen; gPatent LLC

(57) ABSTRACT

A Successive-Approximation Register Analog-to-Digital Converter (SAR-ADC) predicts compensation values for use in a future cycle. A compensation value is applied to capacitors in a calibration Y-side capacitor array to compensate for capacitance errors in a binary-weighted X-side capacitor array. Two compute engines pre-calculate predicted-0 and predicted-1 compensation values for a next bit to be converted. At the end of the current cycle when the comparator determines the current bit, the comparator also controls a mux to select one of the two predicted compensation values. Thus the compensation value is available at the beginning of the next bit's cycle, eliminating a long calculation delay. The compensation value for the first bit to be converted, such as the MSB, is calculated during calibration. Compensation values for other bits are data-dependent. Calibration values are accumulated during calibration to generate the first conversion compensation value for the first bit to be converted.

18 Claims, 11 Drawing Sheets

PARALLEL PIPELINED CALCULATION OF TWO CALIBRATION VALUES DURING THE PRIOR CONVERSION CYCLE IN A SUCCESSIVE-APPROXIMATION-REGISTER ANALOG-TO-DIGITAL CONVERTER (SAR-ADC)

FIELD OF THE INVENTION

This invention relates to analog-to-digital converters (ADC), and more particularly to pipelining methods to improve the speed of Successive-Approximation Register (SAR) ADC's.

BACKGROUND OF THE INVENTION

Analog and digital circuits are both present in some system chips. Signals may cross from the digital domain to the analog domain, and vice-versa. Analog signals may be converted to digital for complex digital processing, such as by a Digital Signal Processor (DSP).

Many types of Analog-to-Digital Converters (ADC's) have been used for a wide variety of applications. Flash ADC's compare analog signal voltages to multiple voltage levels in an instant to produce a multi-bit digital word that represents the analog voltage. Successive-approximation ADC's use a series of stages to convert an analog voltage to digital bits. Each stage compares an analog voltage to a reference voltage, producing one digital bit. In sub-ranging ADC's, each stage compares an analog voltage to several voltage levels, so that each stage produces several bits. Succeeding stages generate lower-significant digital bits than do earlier stages in the pipeline.

Algorithmic, re-circulating, or recycling ADC's use a loop to convert an analog voltage. The analog voltage is sampled and compared to produce a most-significant digital bit. Then the digital bit is converted back to analog and subtracted from the analog voltage to produce a residue voltage. The residue voltage is then multiplied by two and looped back to the comparator to generate the next digital bit. Thus the digital bits are generated over multiple cycles in the same comparator stage.

FIG. 1 shows a Successive-Approximation-Register ADC. Successive-Approximation-Register SAR 102 receives a clock CLK and contains a register value that is changed to gradually zero-in on a close approximation of the analog input voltage VIN. For example, the value in SAR 102 may first be 0.5, then 0.25, then 0.375, then 0.312, then 0.281, then 0.296, then 0.304, then 0.308, then 0.31, then 0.311, and finally 0.312 when comparing to a VIN of 0.312 volts. SAR 102 outputs the current register value to digital-to-analog converter (DAC) 100, which receives a reference voltage VREF and converts the register value to an analog voltage VA.

The input analog voltage VIN is applied to sample-and-hold circuit 104, which samples and holds the value of VIN. For example, a capacitor can be charged by VIN and then the capacitor isolated from VIN to hold the analog voltage. The sampled input voltage from sample-and-hold circuit 104 is applied to the inverting input of comparator 106. The converted analog voltage VA is applied to the non-inverting input of comparator 106.

Comparator 106 compares the converted analog voltage VA to the sampled input voltage and generates a high output when the converted analog voltage VA is above the sampled VIN, and the register value in SAR 102 is too high. The register value in SAR 102 can then be reduced.

When the converted analog voltage VA is below the sampled input voltage, comparator 106 generates a low output to SAR 102. The register value in SAR 102 is too low. The register value in SAR 102 can then be increased for the next cycle.

The register value from SAR 102 is a binary value of N bits, with D(N−1) being the most-significant-bit (MSB) and D0 being the least-significant-bit (LSB). SAR 102 can first set the MSB D(N−1), then compare the converted analog voltage VA to the input voltage VIN, then adjust the MSB and/or set the next MSB D(N−2) based on the comparison. The set and compare cycle repeats until after N cycles the LSB is set. After the last cycle, the end-of-cycle EOC signal is activated to signal completion. A state machine or other controller can be used with or included inside SAR 102 to control sequencing.

DAC 100 or sample-and-hold circuit 104 may have an array of capacitors. The capacitors have binary-weighted values, such as 1, 2, 4, 8, 16, 32, . . . times a minimum capacitor size. For example, a 6-bit DAC may have an array of capacitors of 1, 2, 4, 8, 16, 32 times a minimum capacitance C. Higher-resolution DAC's such as a 11-bit DAC have much larger capacitor values, such as $2^{N-1}=1024$.

FIG. 2 is a graph showing a SAR ADC resolving an input voltage. The register value in SAR 102 is initially set to one-half, or 10000. Comparator 106 determines that the input voltage VIN is less than the converted value from SAR 102, so in the next iteration SAR 102 is set to one-quarter, or 01000. Comparator 106 determines that the input voltage VIN is greater than the converted value from SAR 102, so in the third iteration SAR 102 is set to three-eighths, or 01100. Comparator 106 determines that the input voltage VIN is less than the converted value from SAR 102 in the third iteration, so in the fourth iteration SAR 102 is set to five-sixteenths, or 01010. Now comparator 106 determines that the input voltage VIN is greater than the converted value from SAR 102, so in the fifth iteration SAR 102 is set to 9/32, or 01011. The final comparison is that VIN is above the converted value, so the final result is 01011.

While such capacitor-array DAC's are useful, the large size of the MSB capacitors requires a large amount of charge to be transferred. The minimum capacitor size C can be shrunk to reduce the overall capacitance of the capacitor array and thus reduce the dynamic power requirements. The minimum capacitor size may be restricted by the process technology. For example, a sub-micron process may allow for a 4×4 μm2 minimum physical-size for a metal-to-metal capacitor, which has a capacitance of about 16 fF.

Matching capacitor values in the binary-weighted array is very important for obtaining precise results. Inherent device and impedance mismatches in deep sub-micron processes limit converter resolutions to about 10 bits.

Resolution can be increased through calibration. Before the input voltage is converted to a digital value, a sequence of steps known as calibration can be performed. Calibration measures each capacitor's mismatches by charge sharing with an additional array of capacitors. Capacitors in the additional array are connected and disconnected until a voltage match occurs. A mis-match value is obtained by recording the enable signals for the capacitors once the final voltage match occurs.

The procedure is then repeated for the next capacitor in the main array, and its mis-match value stored. Once the calibration procedure has operated upon all capacitors in the main array, the mis-match values are saved for each of the capacitors as capacitor coefficients. These capacitor coefficients can then program the second array to subtract out the mis-match errors as the analog input voltage VIN is processed. As successively smaller capacitors are evaluated in the main array, their saved capacitor coefficients are applied to the second capacitor array.

In the example of FIG. 2, when the MSB D4 is converted, the MSB capacitor is switched to receive the shared charge and lower-significance capacitors are switched off or isolated. The error for the MSB capacitor was previously determined by calibration as 10000, and this calibration value of 10000 is applied to the second (calibration) array of the DAC to compensate for the MSB capacitor's error in the main array. The value of the MSB is determined to be 0. Then the penultimate MSB capacitor is switched to share charge in the main DAC, but the MSB capacitor is isolated in the main array since the MSB's digital value was determined to be zero (D4=0). The error for the penultimate MSB was determined to be 01000 during calibration, and the calibration value of 01000 is applied to the second (calibration) array to compensate. The comparator determines that the penultimate MSB D3=1.

In the next cycle, the MSB capacitor is isolated but the MSB-1 and MSB-2 capacitors are connected to share charge in the main array. The calibration values for both the MSB-1 and MSB-2 capacitors are read and added together to get the compensation value of 01100 that is applied to the second array to compensate for the errors of both the MSB-1 and MSB-2 capacitors. The comparator determines that the MSB-2 digital value D2=0.

In the fourth cycle, the MSB capacitor and the MSB-2 capacitors are isolated but the MSB-1 and MSB-3 capacitors are connected to share charge in the main array. The calibration values for both the MSB-1 and MSB-3 capacitors are read and added together to get the compensation value of 01010 that is applied to the second array to compensate for the errors of both the MSB-1 and MSB-3 capacitors. The comparator determines that the MSB-3 digital value D1=1.

In the final cycle, the MSB capacitor and the MSB-2 capacitors are isolated but the MSB-1 and MSB-3 and LSB capacitors (D3, D1, D0) are connected to share charge in the main array. The calibration values for the MSB-1 and MSB-3 and LSB capacitors (D3, D1, D0) are read and added together to get the compensation value of 01011 that is applied to the second array to compensate for the errors of the connected capacitors D3, D1, D0. The comparator determines that the LSB digital value is D0=1. Thus the final result is that the digital value 01011 represents the analog input voltage.

FIG. 3 is a diagram of a SAR ADC with binary-weighted capacitor arrays and a calibration sub-DAC capacitor array. Binary-weighted X-side capacitor array 40 has capacitors 22-28 that connect to node VX that carries voltage VX to the inverting input of comparator 20.

The non-inverting input of comparator 20 connects to the Y-side capacitor array, which is used for calibration and compensation of errors in capacitors 22-28 in binary-weighted X-side capacitor array 40.

Binary-weighted calibration Y-side capacitor array 42 has capacitors 52-58 that connect to node VY that carries voltage VY to the non-inverting input of comparator 20. A calibration value Y5:Y0,YT is applied to switches 68-62. YT is the termination bit.

The resolution of the ADC is one less than the number of binary bits stored in Successive-Approximation-Register (SAR) 206. SAR 206 stores termination bit XT in addition to binary bits X5:X0. SAR 206 also stores the calibration Y-side bits Y5:Y0, YT.

Before a differential analog input voltage VINP, VINN, is converted to a digital value, a calibration procedure is performed. The calibration procedure first finds the mis-match errors for each of capacitors 28-22 in binary-weighted X-side capacitor array 40 and stores the error coefficients for each of the X-side capacitors. Then the calibration process may be reversed and performed on capacitors 58-52 in binary-weighted calibration Y-side capacitor array 42, and the resulting Y-side error coefficients stored for each of the Y-side capacitors.

Once calibration is completed, normal operation occurs in which analog voltages are converted to digital values. The error coefficients are used to successively program switches 68-62 in calibration Y-side capacitor array 42 to subtract the mis-match errors as each of X-side capacitors 28-23 are evaluated.

During normal operation, binary-weighted X-side capacitor array 40 has switches 32-38 that switch input voltage VINP to the bottom plate of capacitors 22-28 during a VIN sampling phase S1, and switch bits X5:X0, XT from SAR 206 during a conversion phase. Grounding switch 112 closes during sampling phase S1 and is open during the conversion phase. The top plates of capacitors 22-28 are connected to the inverting input of comparator 20 and generate voltage VX.

Capacitors 22-28 increase in binary weights or multiples of the minimum capacitor size C/64, with capacitance C/64 for termination capacitor 22 and capacitor 23, capacitance C/32 for capacitor 24, and capacitance of C/8 for capacitor 26. Capacitors 28, 27 have capacitances of C/2 and C/4. The capacitor size and arrangement in binary-weighted X-side capacitor array 40 on the X-side is matched by that in binary-weighted Y-side capacitor array 42.

The X-side bits X5:X0, XT from SAR 206 are applied to the bottom plates of capacitors 22-28 in binary-weighted X-side capacitor array 40 during the conversion phase. The bottom plates are connected to Vinp during the sampling phase S1 of normal operation. Control logic 204 can generate control signals such as S1 and adjust values in SAR 206 in response to compare results from comparator 20. Once all bits in SAR 206 have been adjusted, a busy signal can be negated to indicate that conversion is complete.

Binary-weighted Y-side capacitor array 42 has switches 62-68 that switch input voltage VINN to the bottom plate of capacitors 62-68 during a first sampling phase, and switch bits Y5:Y0, YT from SAR 206 during a conversion phase of normal operation. Grounding switch 114 closes during sampling phase S1 and is open during the conversion phase. The top plates of capacitors 52-58 are connected to the inverting input of comparator 20 and generate voltage VY.

During normal operation, a differential analog input voltage is applied to inputs VINP, VINN. If a single-ended analog voltage were used, it could be applied to VINP and a fixed voltage such as ground or VDD/2 could be applied to VINN. Binary-weighted X-side capacitor array 40 can act as sample-and-hold circuit while binary-weighted Y-side capacitor array 42 acts as DAC 100 of FIG. 1.

FIG. 4A shows a prior-art timing of operation of the DAC of FIG. 3. Calibration values are stored for each of capacitors 22-28 of FIG. 3 during a calibration procedure. During conversion of an analog voltage to a digital value, a top-down procedure is used. The MSB is tested first by charge sharing with the MSB capacitor 28, while a calibration value Y5:Y0 for this MSB capacitor is applied to capacitors 62-68 in calibration Y-side capacitor array 42. Then successively smaller digital bits are tested using smaller capacitor in binary-weighted X-side capacitor array 40. The calibration value applied to calibration Y-side capacitor array 42 at each step depends on which of capacitors 62-68 is connected to share charge with line VX during that cycle, which depends on the bit being tested, and the results of earlier (higher-significant bits) tested earlier. Thus the compensation value at each step must be calculated and depends on the earlier results.

The calibration values applied to calibration Y-side capacitor array 42 are know as the compensation value, since it is a sum of calibration values for the currently connected capacitors in binary-weighted X-side capacitor array 40.

In FIG. 4A, bit N+1 is being converted from analog to a digital value, then bit N, and then bit N−1. A conversion-cycle clock CLK times synchronizes conversions.

At the beginning of each bit's cycle, the conversion value is calculated during time period 120. The calibration values for the capacitors in binary-weighted X-side capacitor array 40 that are connected are read and summed to get the conversion value during time period 120. Then the calculated conversion value is applied to the capacitors in calibration Y-side capacitor array 42, such as by switching voltages to these capacitors, during time period 12. Then charge sharing occurs and the voltages applied to comparator 20 change. The comparator output eventually settles to a stable result during time period 124. The comparator result is analyzed to determine the digital value for bit N+1.

Once this digital value for bit N+1 is known, then the capacitors in binary-weighted X-side capacitor array 40 can be switched to test the next bit N. The compensation value for bit N cannot be determined until the result for bit N+1 is known, which occurs after the comparator has settled during time period 124.

When a higher frequency is used for cycle clock CLK, such as 1 GHz, the time available for calculations and analog comparison is reduced. FIG. 4B shows reduced timing at higher conversion frequencies. The compensation values CAL_CAP are not available until calculations are completed in time period 120. The higher frequency of CLK means that these calculations occupy a larger portion of time, and time period 120 is stretched. There may be less available time period 12 for applying these compensation values to calibration Y-side capacitor array 42. Analog comparison also takes relatively more time period 124. There may be insufficient remaining time 14 for the compare result to be analyzed and the set-up times before the next rising edge of CLK to be met for logic to be met within the circuits. Thus higher-frequency operation may not be possible due to the relatively long times to read calibration values and calculate compensation values for each bit's cycle during conversion.

What is desired is an ADC with a calibration DAC to measure capacitor mis-match errors. A SAR ADC with more efficient generation of conversion values from stored calibration values is desired to allow for higher-speed operation. A calibration ADC that operates at high frequencies is desired.

DETAILED DESCRIPTION

The present invention relates to an improvement in calibrated SAR-DAC ADC's. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that calculation of compensation values can limit high-frequency operation of a SAR-ADC. The calculation of a bit's compensation value depends on the result of the prior bit's analog comparison. However, the inventors realize that there are only two possible outcomes of the comparison. The compare result and the bit can be 0 or 1. The bit's compensation value can be calculated twice. The compensation value can be calculated assuming that the compare result of the prior bit was a 0, and can be calculated a second time assuming that the prior bit's compare result was a 1.

When both possible compensation values are pre-computed, then a simple mux can select from among the two possible values once the compare result is known. Thus the calculation delay can be reduced from a complex add delay to a mux delay.

Figure 1:
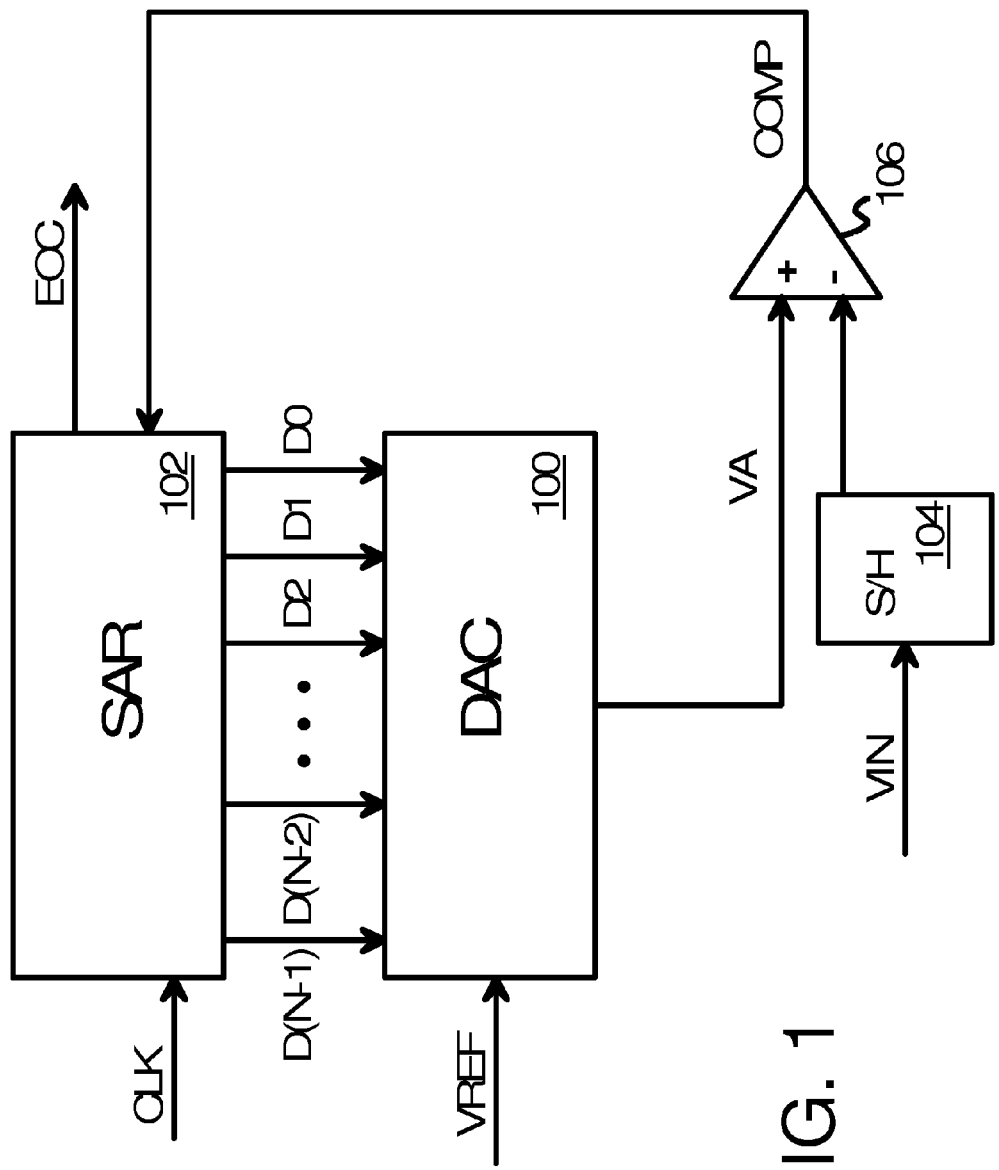
FIG. 1 shows a Successive-Approximation-Register ADC.
Figure 2:
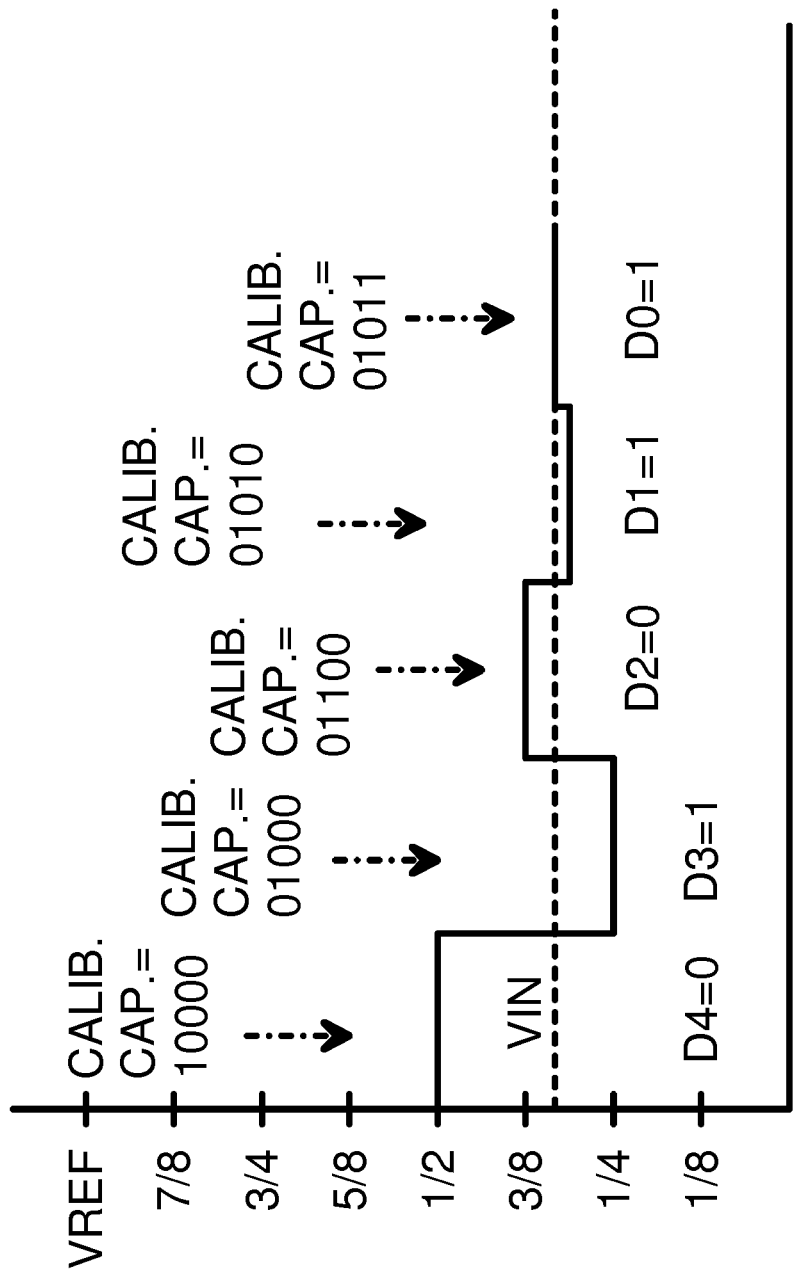
FIG. 2 is a graph showing a SAR ADC resolving an input voltage.
Figure 3:
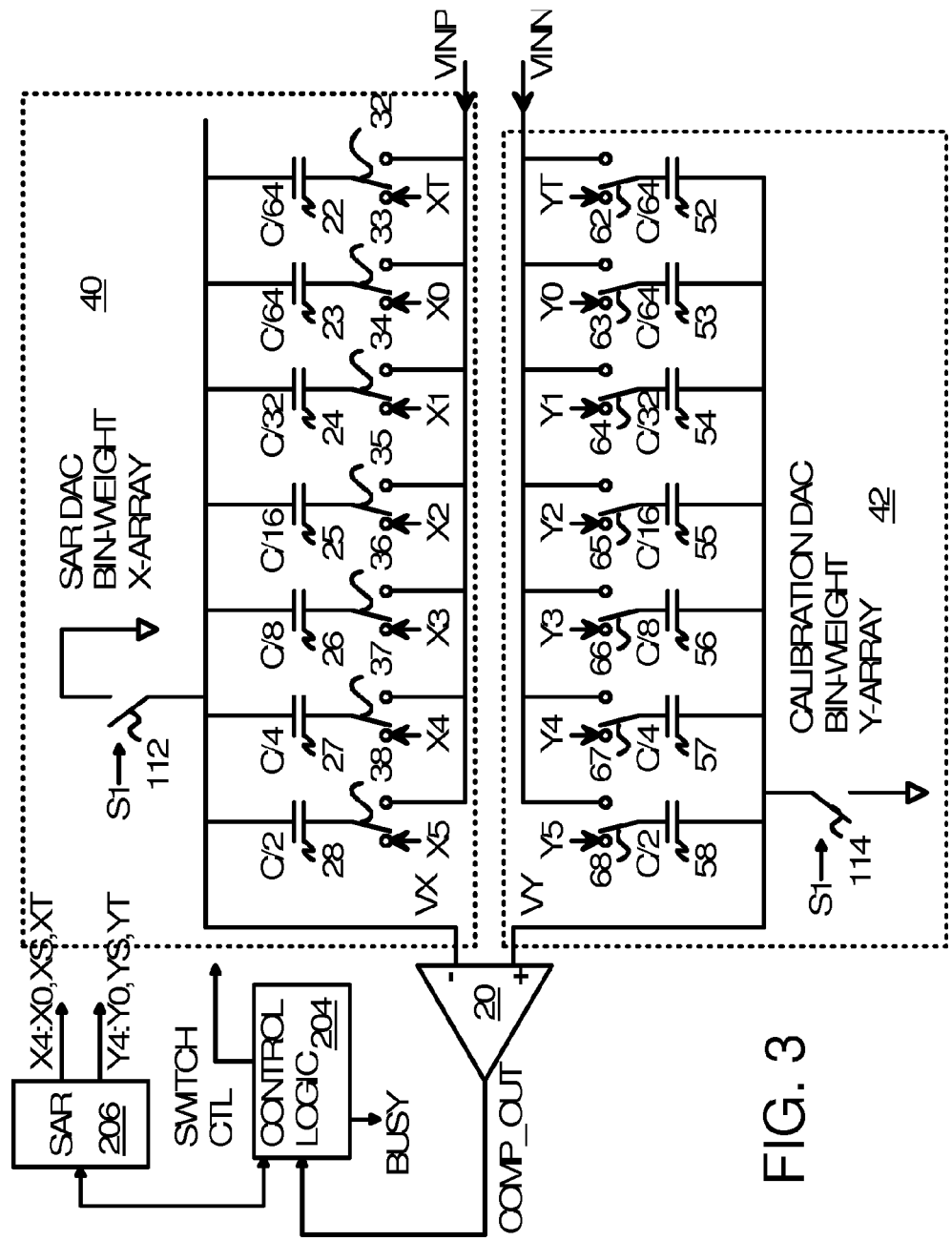
FIG. 3 is a diagram of a SAR ADC with binary-weighted capacitor arrays and a calibration sub-DAC capacitor array.
Figure 4A:
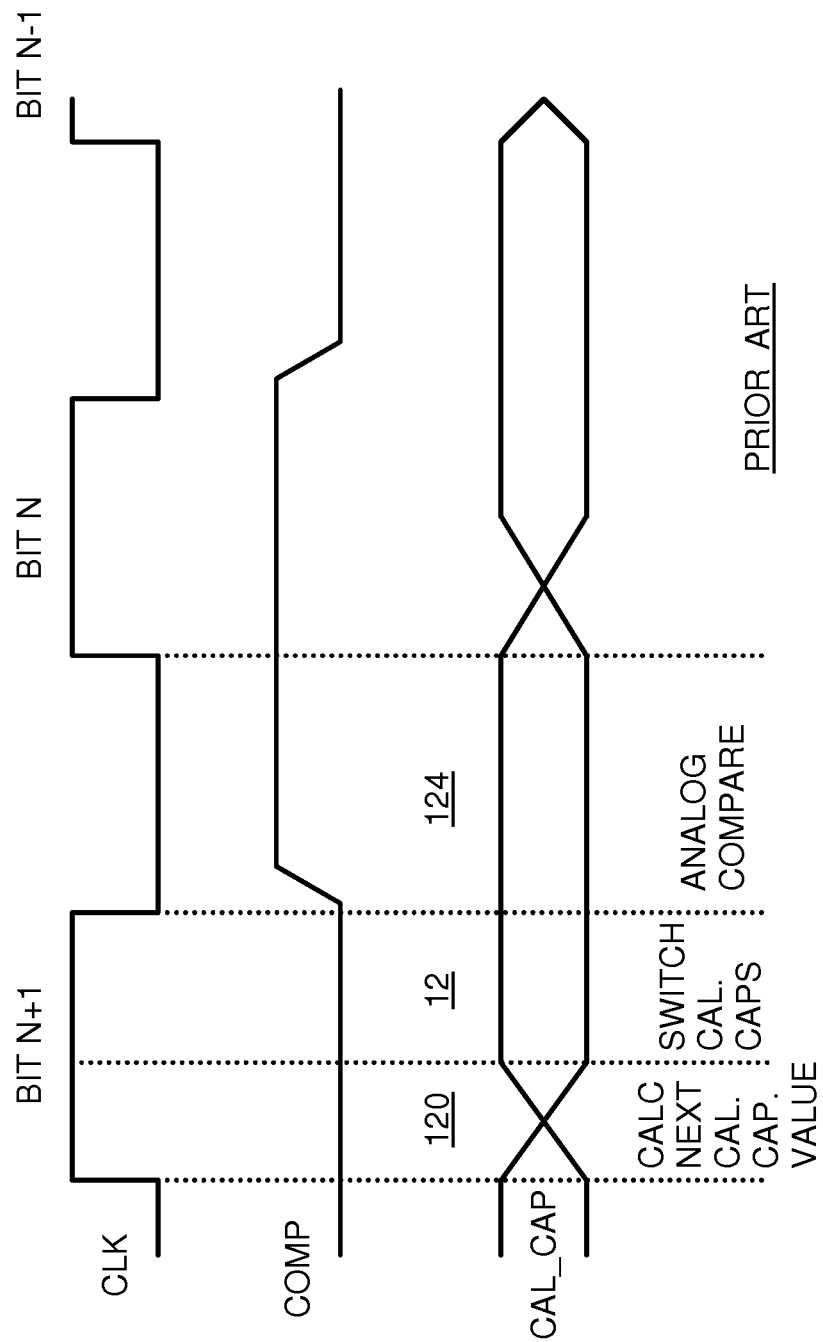
FIG. 4A shows a prior-art timing of operation of the DAC of FIG. 3.
Figure 4B:
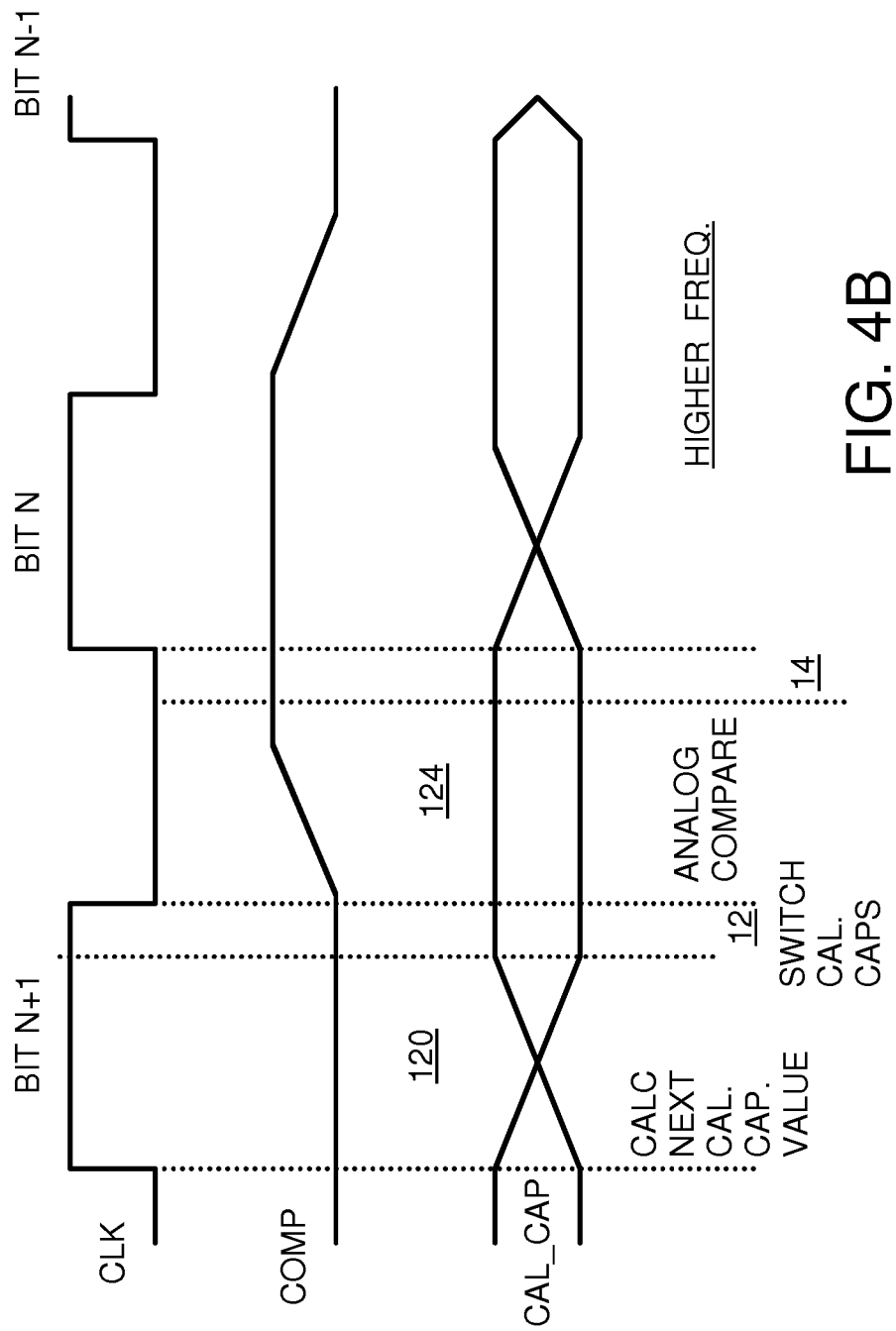
FIG. 4B shows reduced timing at higher conversion frequencies.
Figure 4C:
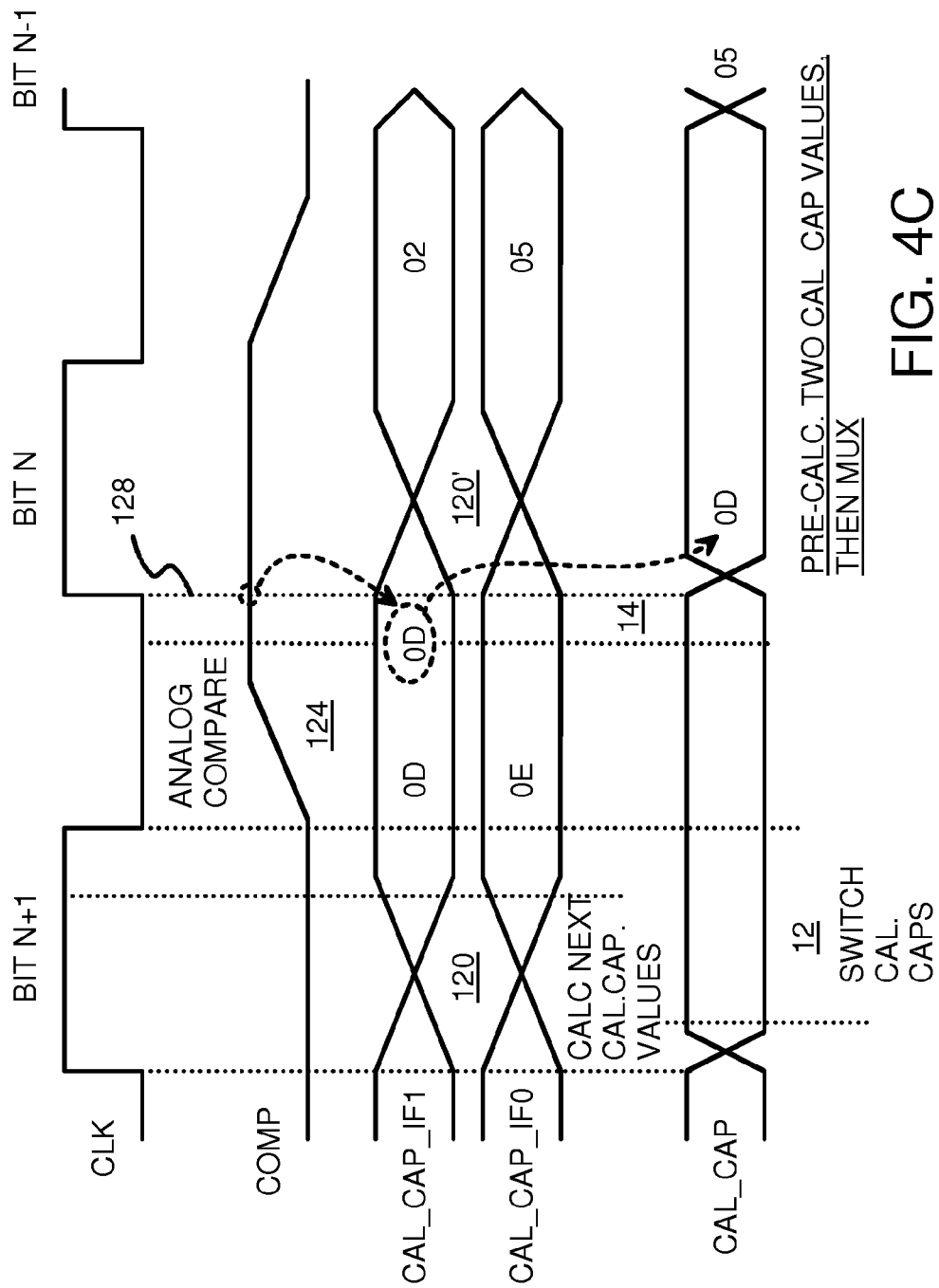
FIG. 4C shows pre-calculation of two compensation values during a prior-bit's cycle in a pipelined SAR-ADC.

FIG. 4C shows pre-calculation of two compensation values during a prior-bit's cycle in a pipelined SAR-ADC. During time period 120 for bit N+1, two calibration compensation values are calculated, CAL_CAP_IF1, which assumes that the analog compare result for bit N+1 will be a 1, and CAL_CAP_IF0, which assumes that the analog compare result for bit N+1 will be a 0. In this example, CAL_CAP_IF1 is calculated to be 0D (00001101) while CAL_CAP_IF0 is 0E (00001110). The pre-calculated compensation values 0D and 0E are available during analog compare time period 124 when comparator 20 (FIG. 3) is determining the result for bit N+1, either 0 or 1. In this example, bit N+1 is 1 after the output of comparator 20, COMP, settles at time 128, the rising edge of CLK.

At time 128, the rising edge of CLK samples COMP as 1 and stores the result for conversion of bit N+1 as 1. Mux logic selects pre-computed compensation value CAL_CAP_IF1, which is 0D, as the compensation values for bit N. CAL_CAP_IF0 is discarded. After the mux delay in time period 120', CAL_CAP is available as 0D. The capacitors in binary-weighted X-side capacitor array 40 and calibration Y-side capacitor array 42 are switched for converting bit N and the value CAL_CAP is applied to capacitors in calibration Y-side capacitor array 42, allowing analog comparison to occur. The digital value for bit N is found to be 0 since COMP goes low.

Compensation values for bit N−1 are pre-calculated during time period 120' for bit N as 02 and 05 for CAL_CAP_IF1 and CAL_CAP_IF0. On the next rising edge of CLK, CAL_CAP_IF0 will be selected as CAL_CAP.

Setup time 14 is met by compare result COMP so that the mux can select from among CAL_CAP_IF1 and CAL_CAP_IF0 after the rising edge of CLK at time 128. Capacitors can be switched during time period 12 once CAL_CAP has stabilized. Note that time period 12 is greatly enlarged since it is not delayed by CAL_CAP_IF1 or CAL_CAP_IF0, only by the mux delay for CAL_CAP. Indeed, time periods 120 and 12 can overlap due to pre-calculation. Thus a higher frequency may be used for CLK.

Figure 5:
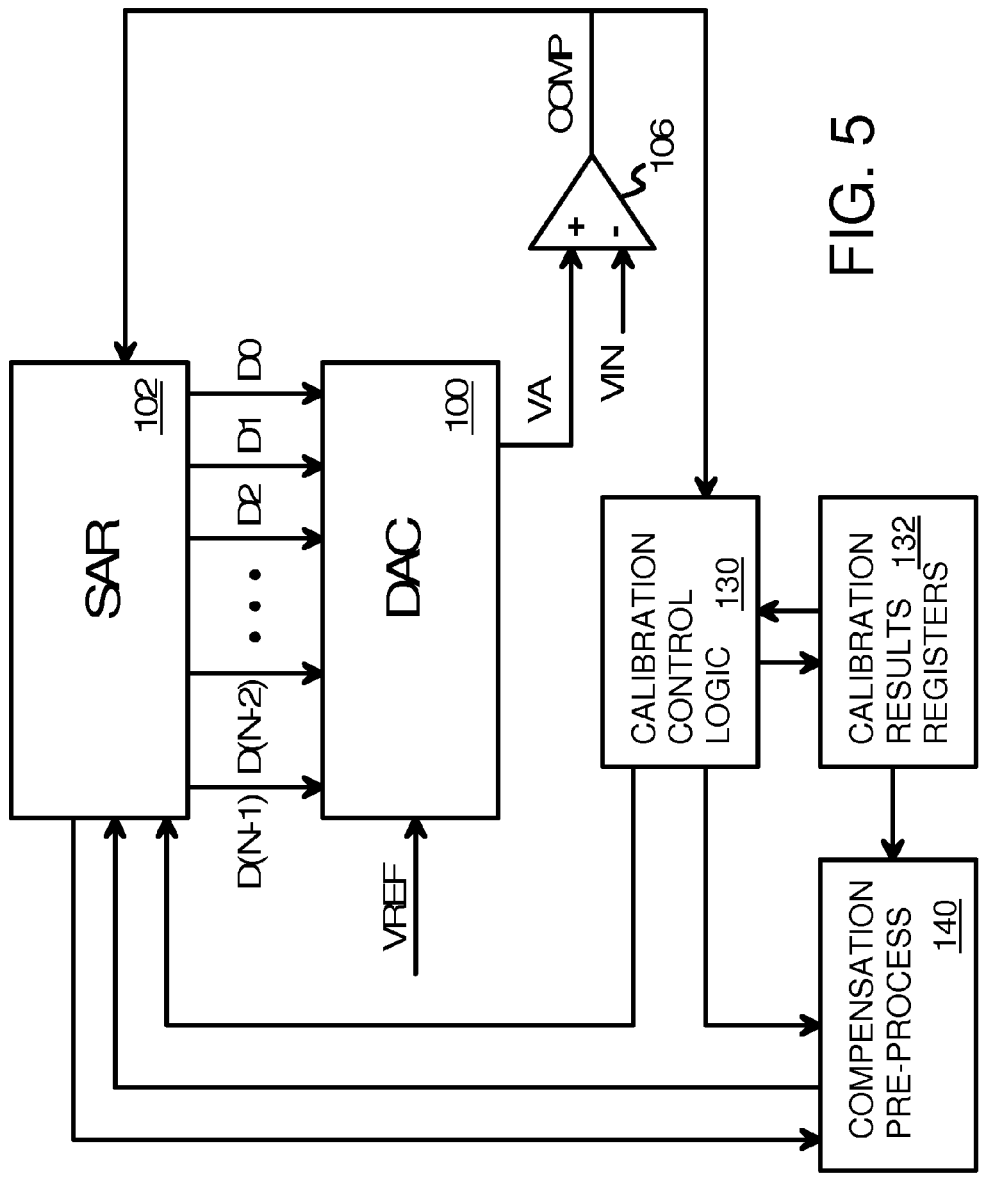
FIG. 5 is a block diagram of a SAR-ADC that pre-computes compensation values.

FIG. 5 is a block diagram of a SAR-ADC that pre-computes compensation values. SAR 102 successively controls capacitors in DAC 100 to share charge to test analog voltage VIN using reference voltage VREF. A differential analog voltage may be substituted. Comparator 106 signals to SAR 102 when the digital value D(N−1):D0 is less than or greater than analog voltage VIN as successive bits are tested.

Calibration control logic 130 is activated before an analog voltage is converted to a digital value. For example, calibration control logic 130 may be activated during initialization. Calibration control logic 130 operates with SAR 102 to test each capacitor in the DAC arrays in DAC 100, and obtain a calibration value for that capacitor. The calibration value represents the error in the capacitance value for that capacitor, and is stored in calibration results registers 132.

After calibration is completed, when an analog voltage VIN is to be converted to a digital value D, compensation pre-process 140 receives the current configuration of capacitors in DAC 100 from SAR 102, and then reads the calibration values for these capacitors from calibration results register 132. Two compensation values are generated for each cycle or digital bit tested—one compensation value assumes the prior bit will be a 1, while the other compensation value assumes that the digital bit will be a 0.

Compensation pre-process 140 operates one cycle ahead, so that it pre-computes compensation values for the next bit while the current bit is still being resolved. Comparator 106 has not yet settled its output when compensation pre-process 140 calculates the two compensation values.

Figure 6:
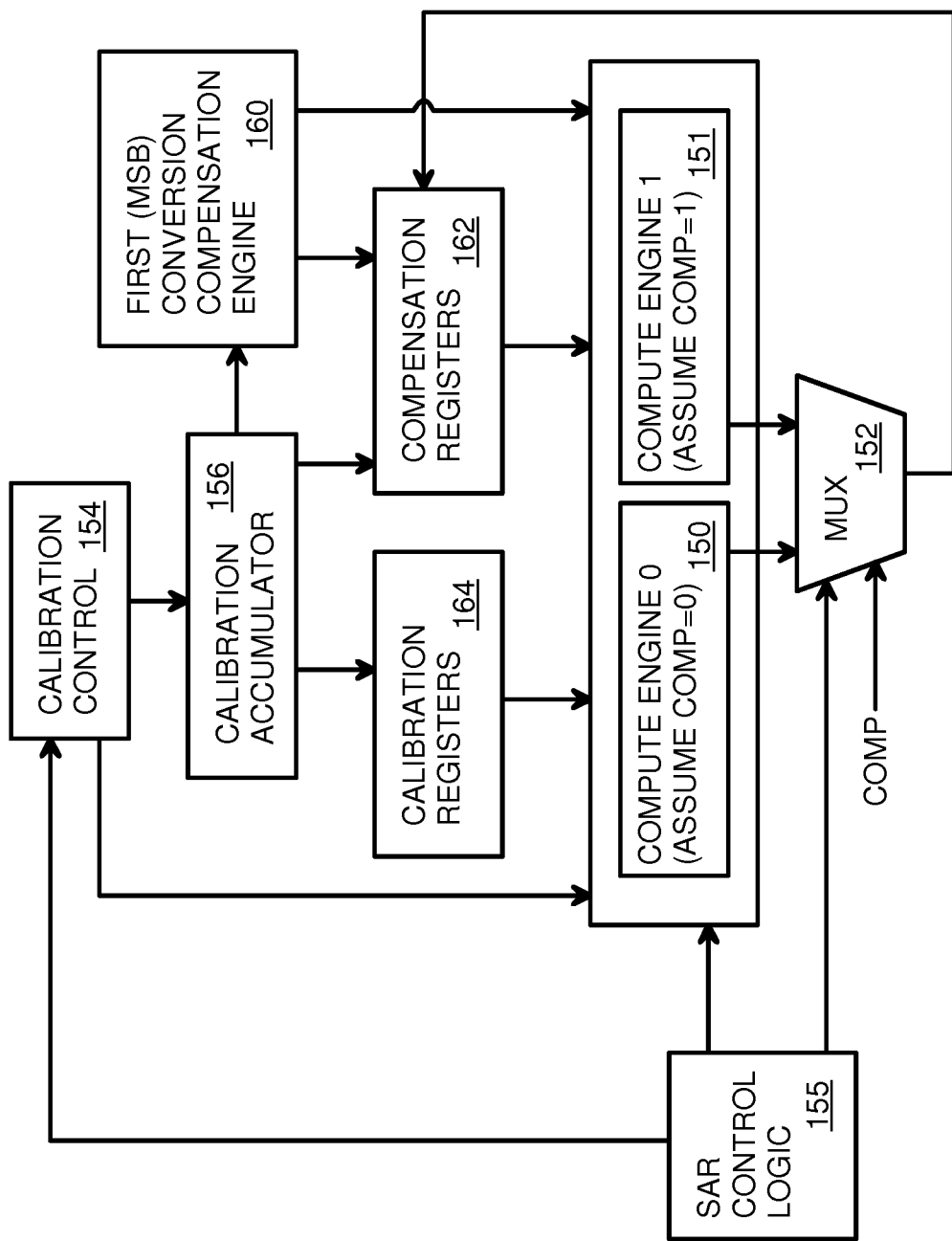
FIG. 6 is a more detailed block diagram of control logic for compensation pre-calculation.

FIG. 6 is a more detailed block diagram of control logic for compensation pre-calculation. Calibration control 154 is activated before analog voltages are converted, such as after initialization. Calibration control 154 performs calibration for each of the capacitors in binary-weighted X-side capacitor array 40 (FIG. 3) to determine their error, which is represented by a calibration value for that capacitor. The calibration values are stored in calibration registers 164. Calibration accumulator 156 accumulates calibration values and is useful for generating calibration and compensation values for combinations of capacitors.

In particular, first conversion compensation engine 160 reads accumulated calibrated values from calibration accumulator 156 and generates the compensation value for the first bit to be tested during each conversion, which is the MSB for top-down conversions. Since the MSB is converted during the first cycle of conversion, there is not a prior cycle to perform pre-calculation, so the pre-calculation is performed by first conversion compensation engine 160. Since all conversions begin with the MSB, the pre-calculation for the MSB can be performed once and used for all conversions. These conversions will differ after the MSB and later bits have been converted, so first conversion compensation engine 160 only generates the pre-calculated conversion value for the first bit, the MSB.

Calibration accumulator 156 can also be used during conversions to aid compute engines 150, 151 in pre-computing the predicted compensation values. Intermediate compensation values that are accumulated may be stored in compensation registers 162 for use in later cycles.

Compute engine 150 assumes that the analog comparator will determine that the current bit is a 0, and calculates the predicted-0 compensation value based on this prediction. Compute engine 151 assumes that the analog comparator will determine that the current bit is a 1, and calculates the predicted-1 compensation value based on this prediction. Compute engines 150, 151 can read from calibration registers 164 various calibration values for capacitors that are predicted to be switched on to share charge in the next cycle. Compute engines 150, 151 can also read prior compensation values or other intermediate values from compensation registers 162 to assist in computations. For example, the upper capacitors may not have changed in the current prediction, only the lower capacitors. So compute engines 150, 151 may read the compensation value for a prior cycle from compensation registers 162 and then adjust for the lower capacitors, rather than compute the compensation value directly from calibration values for all capacitors.

SAR control logic 155 controls the sequence of switching capacitors in the DAC arrays during calibration and during conversion. During conversion, the analog compare result from comparator 106 (FIG. 5) COMP is applied to mux 152 to select either the predicted-0 result from compute engine 150 when the analog compare result indicates that the current bit is 0, or the predicted-1 result from compute engine 151 when the analog compare result indicates that the current bit is 1. This occurs at the end of the current bit's cycle.

At the start of the next cycle when the next bit is being evaluated, the compensation value selected by mux 152 is applied to the calibration Y-side capacitor array 42 so set the error value for the next bit being evaluated. The delay through mux 152 is much less than the delay through compute engines 150, 151, so there is more time in the next cycle for the switches to switch and for the analog voltages to settle after charge sharing, and for comparator 106 to settle the result for the next bit.

The compensation value selected by mux 152 may also be stored in compensation registers 162 for use by compute engines 150, 151 in computing the predicted compensation values.

Figure 7:
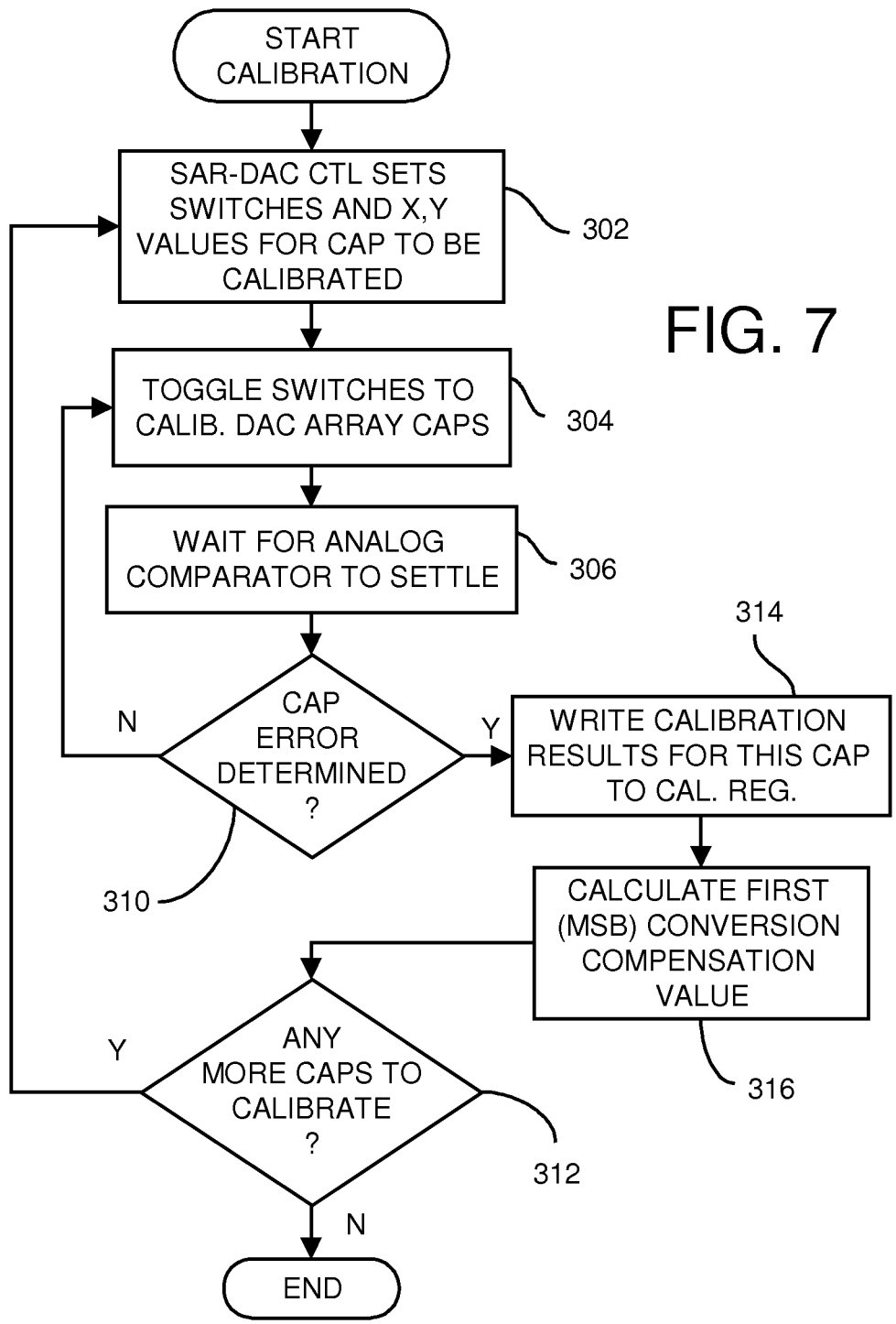
FIG. 7 is a flowchart of a calibration process.

FIG. 7 is a flowchart of a calibration process. Calibration starts with the MSB capacitor in binary-weighted X-side capacitor array 40 and then proceeds with all smaller capacitors until the LSB capacitor is calibrated. The SAR DAC control logic sets switches and voltage values in binary-weighted X-side capacitor array 40 and calibration Y-side capacitor array 42 for calibrating the MSB capacitor, step 302.

To determine the calibration value for the MSB capacitor, the switches and voltages are first set in step 302, and then some of the switches are toggled in step 304 to move charge. The voltage on lines VX, VY (FIG. 3) change when the switches are toggled. The amount of voltage change is related to the charge and capacitances by charge conservation, Q=CV, so by measuring voltage changes, the capacitance changes due to the switch toggling may be deduced.

The analog comparator compares the new voltages VX, VY after toggling, and settles after a period of time, step 306. The comparator output value indicates which of voltages VX, VY is larger. Sometimes multiple tests of switch combinations may be required to determine the error value for a capacitor being calibrated, and when the error has not yet been determined, step 310, then the switches are toggled into a different combination, step 304, and the analog comparison repeated, step 306.

Once the error value has been determined for a capacitor being calibrated, step 310, then the calibration value for this capacitor is written into the calibration registers, step 314. The calibration accumulator may also add this calibration to a running sum that is used to calculate the first conversion compensation value for the MSB, step 316.

When there are more capacitors to calibrate, step 312, then the next capacitor is selected for calibration, such as the MSB-1 capacitor, and the process repeated from step 302. The calibration value for this capacitor is eventually determined and stored, step 314, and its calibration value added to a running sum of earlier calibration values by the calibration accumulator in step 316.

When all capacitors have been calibrated in binary-weighted X-side capacitor array 40, the calibration accumulator contains the final value for the first conversion compensation value for the MSB. Thus the first conversion compensation value for the MSB does not have to be re-calculated for each conversion, since the switch settings for testing the MSB are the same for all conversions. Thus the conversion value for the first cycle (converting the MSB) has been pre-calculated during calibration.

Figure 8:
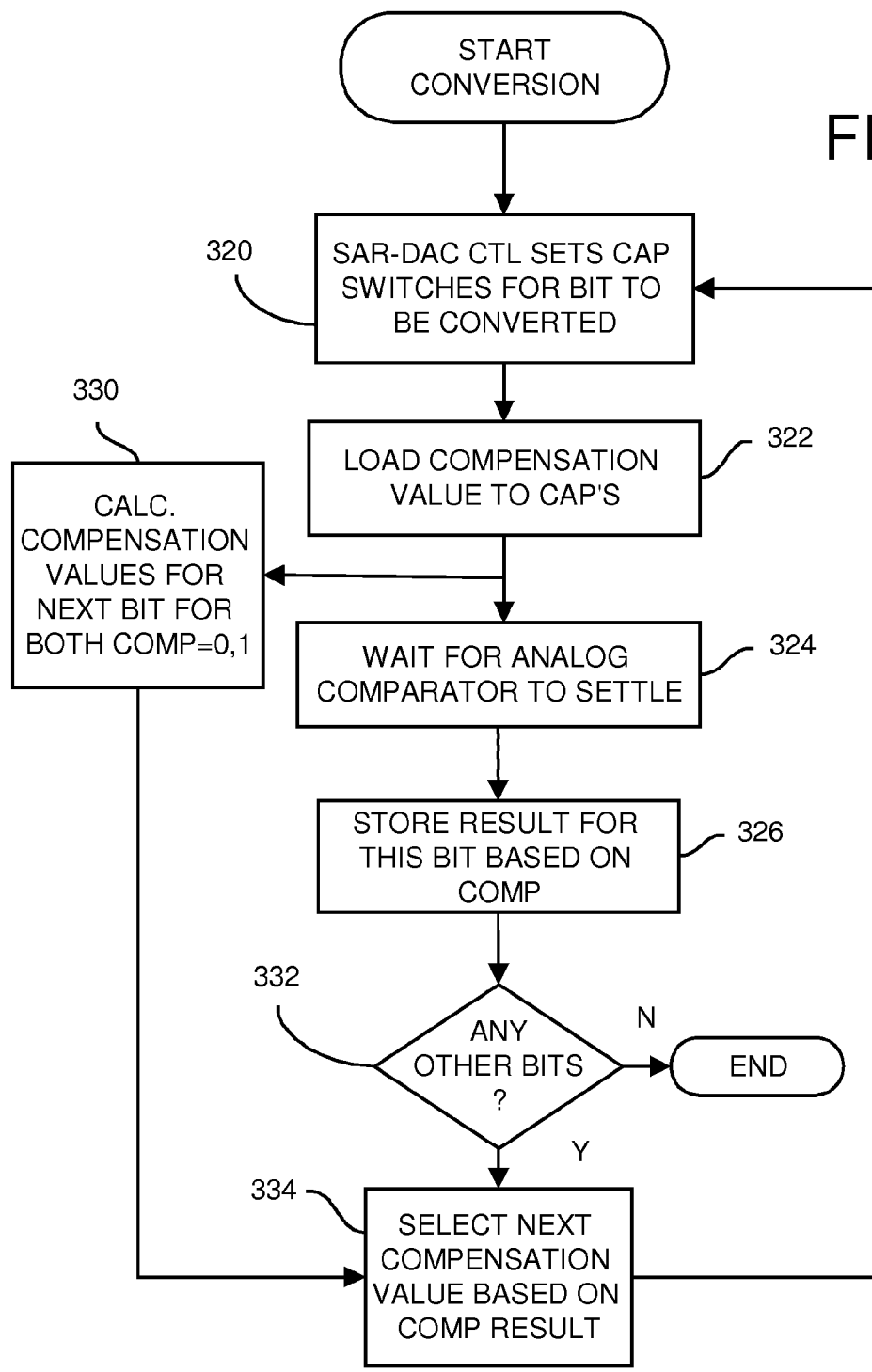
FIG. 8 is a flowchart of a conversion process using pre-calculation of predicted calibration values.

FIG. 8 is a flowchart of a conversion process using pre-calculation of predicted calibration values. Conversion occurs after all calibration values have been determined, and after the first conversion compensation value for the MSB has been calculated.

The SAR-DAC control logic sets the switches and applied voltages for testing the current bit to be converted, step 320. This switch setting is the same for the first conversion when the MSB is tested, but depends on higher-order bits that have already been converted when converting intermediate and LSB bits. Thus the switch setting for intermediate bits depends on the outcome of earlier conversions, or is data-dependent.

To correct for errors in capacitance values of capacitors that are switched on in binary-weighted X-side capacitor array 40, a compensation value is applied to capacitors in calibration Y-side capacitor array 42, step 322. The compensation value was selected by mux 152 (FIG. 6) and is either the predicted-1 value or the predicted-0 value. This selected compensation value is used to calculate the two predicted compensation values for the next bit, step 330.

The SAR-DAC control logic waits for the comparator to settle, step 324, and determines and stores the result for the current bit as either a 0 or a 1, depending on the output of the comparator, step 326. When there are more bits to convert from analog to binary digital value, step 332, then the next-most-significant bit is selected for conversion. In step 334, the result from the analog comparator (steps 324, 326) is used by mux 152 to select either the predicted-0 or the predicted-1 compensation value that was generated earlier in step 330. The process then loops back, with the SAR-DAC control logic setting switches for converting the next bit, step 320. The compensation value selected in step 334 is applied to the capacitors in calibration Y-side capacitor array 42 in step 322 to compensate for the error in capacitors switched on during step 320. The process repeats for the next bit and for all subsequent bits until the LSB is reached.

Figure 9:
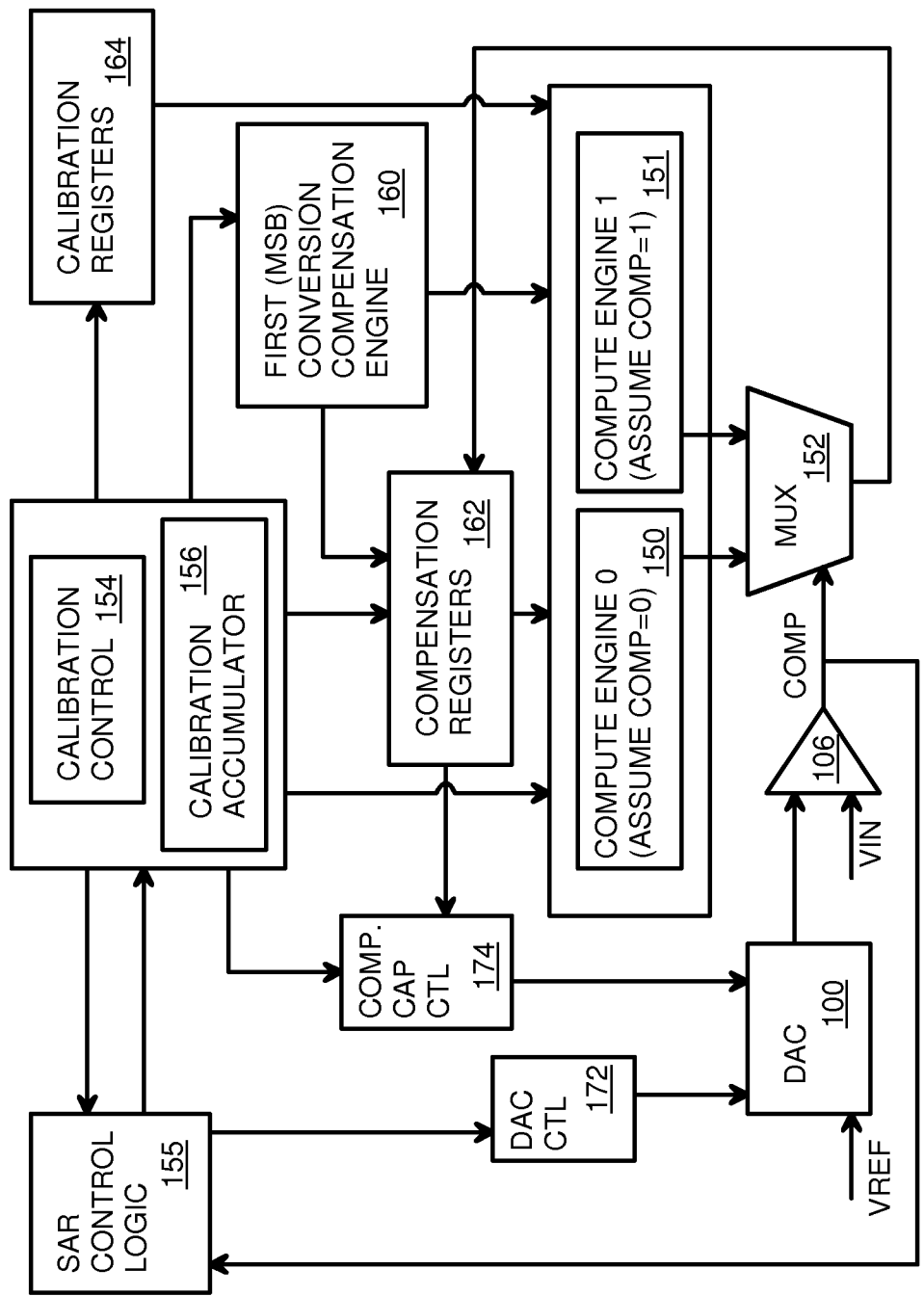
FIG. 9 is a more detailed block diagram of a SAR-DAC that pre-computes predicted compensation values to reduce calculation delays.

FIG. 9 is a more detailed block diagram of a SAR-DAC that pre-computes predicted compensation values to reduce calculation delays. SAR control logic 155 reads the compare output COMP from comparator 106 to determine the current bit's digital value, and to determine switch settings for a next cycle to convert a next bit. DAC control 172 sets switches in DAC 100 which adjusts capacitors that are used for charge sharing to generate a voltage applied to comparator 106.

Compensation capacitor control 174 reads a compensation value from compensation registers 162 and applies or switches voltages that represent this compensation value to capacitors in calibration Y-side capacitor array 42 (FIG. 3) within DAC 100. Thus the error represented by the compensation value is subtracted out.

Compute engines 150, 151 pre-calculate two predicted compensation values, assuming that comparator 106 will determine that the current bit is a 1 (predicted-1 compensation value from compute engine 151) and assuming that comparator 106 will determine that the current bit is a 0 (predicted-0 compensation value from compute engine 150). Mux 152 selects one of these predicted compensation values from compute engines 150, 151 once the COMP output from comparator 106 is settled. The selected compensation value from mux 152 is stored in compensation registers 162 and used in the next cycle by compensation capacitor control 174 to set the error value in calibration Y-side capacitor array 42 in DAC 100.

During calibration, calibration control 154 sequences the switches and applied voltages in DAC 100 to determine calibration values for each capacitor, which are stored in calibration registers 164. These calibration values are accumulated by calibration accumulator 156 so that when all capacitors have been calibration, the value in calibration accumulator 156 may be used to compute the first conversion value by first conversion compensation engine 160. The first conversion value is for the MSB. Since there are no bits above the MSB, the first conversion value is not data-dependent. Thus the same first conversion compensation value may be used for converting the MSB for all analog voltages converted.

ALTERNATE EMBODIMENTS

Several other embodiments are contemplated by the inventors. For example calibration values do not have to be stored for all capacitors, such as the termination capacitor or one or more of the LSB capacitors, since the larger errors occur with the larger capacitors. While calculation of two compensation values in parallel has been described using two compute engines, a single compute engine could be used twice if sufficient time was available. Pre-calculation could extend into the analog compare time 124 rather than be completed during time period 120. Alternately, four conversion values could be pre-calculated for very short clock cycles when calculation requires two clock cycles.

Rather than have a single calibration value for a capacitor, there may be several calibration values, or parameters for an equation that calculates the calibration value for a particular arrangement or sequence of capacitors. Rather than just add calibration values of several capacitors, there may be second-order effects that are compensated for that depend on various combinations of capacitors. Thus calibration values can be more complex yet still used to generate compensation values that are functions of multiple factors. Computation of calibration and calibration values may be more complex than simply adding or accumulating error values for individual capacitors. Each bit-cycle may have several phases, and switch settings and value applied to the capacitors may be toggled or adjusted between these phases to move charge and adjust voltages applied to the comparator. Additional phases may be inserted to isolate switch noise caused by turning off switches.

Latches, flip-flops, registers, and other storage devices may be inserted in the logic and data paths to allow for synchronization to clocks for timing and pipelining purposes. Buffers, capacitors, filters, resistors, and other components may also be added for various purposes.

Rather than have a fully binary-weighted capacitor array, a combination of a binary-weighted capacitor array and a non-weighted capacitor array can provide a desired resolution while still reducing total capacitance and dynamic power. While an application in a SAR ADC has been described, the circuit and calibration steps may be used for other applications and systems.

The number of bits in binary-weighted X-side capacitor array 40 and calibration Y-side capacitor array 42 may be adjusted. The smallest coefficient, the control for the terminal capacitor, may be discarded in some embodiments.

Rather than a top-down approach, where the MSB capacitor is calibrated first, then the next MSB, and repeated until the LSB capacitor is calibrated last, a bottom-up sequence could be substituted, where the LSB capacitor is calibrated first, and the MSB capacitor is calibrated last.

Both differential and single-ended analog voltages may be converted. A single-ended analog voltage may be applied to one differential input, while a reference voltage is applied to the other differential input.

The binary-weighted capacitor array could be thermometer-weighted or use gray codes or some other weighting arrangement. The binary bits from SAR 206 can be merged with other control or timing information, such as from control logic 204 or a sequencer or multi-phase non-overlapping clock.

The number of bits in the register value in SAR 206 can be adjusted to achieve the desired accuracy. For example, when N is 16 bits and VREF is 2 volts, the LSB represents 30 micro-volts, which is the precision of the ADC. A different number of bits could be substituted for a different precision, and the number of bits could be fixed or could be variable.

Some embodiments may not use all components. For example, switches may be added or deleted in some embodiments. Different kinds of switches may be used, such as 2-way switches or 3-way switches. Muxes may be used as switches. Input resistors could be added to VINP, VINN or more complex input filters used. Multiple levels of switches may be used, such as 2-way switches for switches, and then an overall switch that connects either VDD or GND to these 2-way switches.

While binary-weighted capacitors have been described, other weightings could be substituted, such as decimally-weighted capacitors, prime-weighted capacitors, or linearly-weighted capacitors, or octal-weighted capacitors. The digital value could be in these other number systems, such as octal numbers rather than binary numbers.

Inversions may be added by swapping inverting and non-inverting inputs as desired, but do not change the overall function and thus may be considered equivalents. The digital conversion values that pass through the switches during the conversion phase could be applied directly to the switches as either data that passes through the switches or as control of the switches. More complex switches could use the conversion values to generate high and low voltages that are applied to the capacitors by the complex switches. Other embodiments of connecting the conversion values to the capacitors through the switches are possible.

The resistance and capacitance values may vary in different patterns. Capacitors, resistors, and other filter elements may be added. Switches could be n-channel transistors, p-channel transistors, or transmission gates with parallel n-channel and p-channel transistors, or more complex circuits, either passive or active, amplifying or non-amplifying.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation.

The final sizes of transistors and capacitors may be selected after circuit simulation or field testing. Metal-mask options or other programmable components may be used to select the final capacitor, resistor, or transistor sizes. Capacitors may be connected together in parallel to create larger capacitors that have the same fringing or perimeter effects across several capacitor sizes.

Comparison of a reference voltage to a single analog voltage could be used, or a differential analog voltage could be compared. The differential input voltage could be latched and then the latched single-ended voltage compared to the DAC voltage. The first voltage could be sampled by a capacitor; then the second voltage could be sampled by the same capacitor. The differential charge is stored on another capacitor through the feedback of the amplifier. Another method for comparing differential analog voltages is to put a differential amplifier at the input with a defined gain. While an operational amplifier (op amp) could be used, other kinds of comparators could be used, such as non-amplifying compare buffers.

An equalizing switch could be added between VX and VY. Two grounding switches could be used on the true and complement inputs lines of the inputs to comparator 20. Rather than grounding, some switches could connect to another fixed voltage, such as VDD or VDD/2.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A pipelined-compensation Successive-Approximation Register (SAR) digital-analog converter comprising:
   a binary-weighted X-side capacitor array having first capacitors with weighted capacitance values, wherein the first capacitors connect to a first charge-sharing line and to a plurality of first switches;
   a calibration Y-side capacitor array having second capacitors with weighted capacitance values, wherein the second capacitors connect to a second charge-sharing line and to a plurality of second switches;
   an analog comparator that compares the first charge-sharing line to the second charge-sharing line and generates a compare output;
   a compensation register that stores a compensation value that represents a capacitance error;
   calibration registers that store calibration values for capacitors in the binary-weighted X-side capacitor array, the calibration values representing capacitance errors;
   a compensation capacitor controller that reads the compensation value from the compensation register and applies the compensation value to the plurality of second switches to cause the calibration Y-side capacitor array to compensate for a capacitance error in the binary-weighted X-side capacitor array;
   a first compute engine that reads calibration values from the calibration registers and generates a predicted-0 compensation value by assuming that the analog comparator generates the compare output in a first state;
   a second compute engine that reads calibration values from the calibration registers and generates a predicted-1 compensation value by assuming that the analog comparator generates the compare output in a second state;
   a mux that receives the predicted-0 compensation value from the first compute engine and receives the predicted-1 compensation value from the second compute engine, the mux outputting as a next compensation value the predicted-0 compensation value when the compare output in the first state, and outputs as the next compensation value the predicted-1 compensation value when the compare output in the second state;
   wherein the next compensation value from the mux is stored into the compensation register as the compensation value for a next bit that is converted after a current bit,
   whereby compensation values are pre-computed based on prediction of the compare output.

2. The pipelined-compensation Successive-Approximation Register (SAR) digital-analog converter of claim 1 wherein the first compute engine generates the predicted-0 compensation value before the analog comparator generates the compare output;
   wherein the second compute engine generates the predicted-1 compensation value before the analog comparator generates the compare output;
   wherein the compare output determines a converted digital value for the current bit and a compensation value for the next bit that is converted after the current bit, whereby compensation values are pre-converted.

3. The pipelined-compensation Successive-Approximation Register (SAR) digital-analog converter of claim 2 further comprising:
   calibration control logic for activating the first and second switches to successively test first capacitors in the binary-weighted X-side capacitor array to determine calibration values to apply to the second capacitors in the calibration Y-side capacitor array to compensate for capacitance errors in the first capacitors, wherein calibration values are stored in the calibration register in response to operation of the calibration control logic.

4. The pipelined-compensation Successive-Approximation Register (SAR) digital-analog converter of claim 3 further comprising:
   a calibration accumulator for accumulating calibration values generated by the calibration control logic for multiple first capacitors over multiple calibration cycles, to generate an accumulated calibration value,
   whereby calibration values are accumulated.

5. The pipelined-compensation Successive-Approximation Register (SAR) digital-analog converter of claim 4 further comprising:
   a first conversion compensation engine for generating a first compensation value for use during a first cycle, the first conversion compensation engine reading the accumulated calibration value from the calibration accumulator;
   wherein the first compensation value is used as the compensation value during an initial cycle.

6. The pipelined-compensation Successive-Approximation Register (SAR) digital-analog converter of claim 5 wherein a most-significant-bit (MSB) of a digital value converted from an analog voltage is generated during the initial cycle.

7. The pipelined-compensation Successive-Approximation Register (SAR) digital-analog converter of claim 2 further comprising:
   SAR control logic, responsive to a bit clock, for activating the compensation register to latch the next compensation value from the mux into the compensation register as the compensation value for the next bit that is converted after the current bit in response to a first edge of the bit clock,
   whereby the next compensation value from the mux is latched by the first edge of the bit clock.

8. A method for converting an analog voltage to a digital value comprising:
   (a) setting switches in a first capacitor array to enable a target capacitor in the first capacitor array to share charge with a first line;
   reading a compensation value from a compensation register;
   applying the compensation value to a second capacitor array to share a second charge with a second line;
   wherein the second charge compensates for an error in the target capacitor;
   comparing voltages of the first line and the second line with a comparator to generate a comparator output;
   before the comparator has generated the comparator output, generating a first predicted compensation value that is a next compensation value when the comparator output is in a first state, and generating a second predicted compensation value that is the next compensation value when the comparator output is in a second state;
   inputting the first predicted compensation value and the second predicted compensation value to a mux;
   at an end of a bit-cycle, using the comparator output to control the mux to select the first predicted compensation value when the comparator output is in the first state, and to select the second predicted compensation value when the comparator output is in the second state;

at the end of the bit-cycle, storing a bit result using the comparator output, the bit result being a bit of the digital value; and repeating from (a) for other bits in the digital value.

9. The method of claim 8 wherein the compensation value includes errors for target capacitors in earlier bit-cycles that had the comparator output in the first state, but do not include errors for target capacitors in earlier bit-cycles that had the comparator output in the second state, wherein the second charge compensates for errors of target capacitors in earlier bit-cycles that are connected to the first line during a current bit-cycle.

10. The method of claim 9 further comprising:

calibrating capacitors in the first array to generate calibration values that indicate errors in the capacitors in the first array;

storing the calibration values into a calibration register;

wherein generating the first predicted compensation value comprises reading the compensation value from the compensation register and reading calibration values from calibration registers and combining the compensation value and the calibration values in response to a configuration of the switches in the first capacitor array.

11. The method of claim 10 wherein capacitors in the first capacitor array and in the second capacitor array have capacitance values that are binary-weighted.

12. The method of claim 9 wherein computation of a conversion value for a bit N is pre-calculated during a cycle for bit N−1, wherein N is a whole number.

13. The method of claim 9 wherein the first predicted compensation value and the second predicted compensation value are generated in parallel at a same time during a prior cycle.

14. A pre-calculating compensated analog converter comprising:

a first charge-sharing line;

a plurality of first switches;

a first array of capacitors having weighted capacitance values, wherein first array capacitors in the first array connect to the first charge-sharing line and to the plurality of first switches;

a first termination capacitor in the first array of capacitors, the first termination capacitor having a same minimum capacitance value as a minimum capacitor, wherein two capacitors in the first array of capacitors have the same minimum capacitance value;

a first analog input having an analog input voltage, a plurality of first digital values;

wherein the plurality of first switches connect the first analog input to the first array of capacitors during a sampling phase during normal operation;

wherein the plurality of first switches connect the first digital values to the first array of capacitors during a conversion phase after the sampling phase during normal operation;

a second charge-sharing line;

a plurality of second switches;

a second array of capacitors having weighted capacitance values, wherein second array capacitors in the second array connect to the second charge-sharing line and to the plurality of second switches;

a second termination capacitor in the second array of capacitors, the second termination capacitor having the same minimum capacitance value as the minimum capacitor, wherein two capacitors in the second array of capacitors have the same minimum capacitance value;

a second analog input having an analog input voltage, a plurality of compensation digital values;

wherein the plurality of second switches connect the second analog input to the second array of capacitors during a sampling phase during normal operation;

wherein the plurality of second switches connect the compensation digital values to the second array of capacitors during a conversion phase after the sampling phase during normal operation;

a comparator that receives a first compare voltage of the first charge-sharing line and compares the first compare voltage to a second voltage of the second charge-sharing line to generate a compare output;

control logic for adjusting the first digital values to the plurality of first switches and for adjusting the compensation digital values to the plurality of second switches;

a compensation register that stores the compensation digital values for a current cycle;

a first predicting compute engine that reads the compensation digital values for the current cycle from the compensation register, and generates a predicted-0 next compensation digital values by assuming that the comparator generates the compare output as a 0 for the current cycle;

a second predicting compute engine that reads the compensation digital values for the current cycle from the compensation register, and generates a predicted-1 next compensation digital values by assuming that the comparator generates the compare output as a 1 for the current cycle; and a mux that outputs the predicted-0 next compensation digital values from the first predicting compute engine when the compare output is a 0, and that outputs the predicted-1 next compensation digital values from the first predicting compute engine when the compare output is a 1;

wherein the compensation register stores the predicted-0 next compensation digital values or the predicted-1 next compensation digital values outputted by the mux for use in a next current cycle, whereby predicted next compensation digital values are selected by the mux and pre-computed in a prior cycle.

15. The pre-calculating compensated analog converter of claim 14 further comprising:

a first grounding switch that grounds the first charge-sharing line;

a second grounding switch that grounds the second charge-sharing line;

wherein the first charge-sharing line is grounded in response to the control logic.

16. The pre-calculating compensated analog converter of claim 15 further comprising:

a calibration controller for generating calibration values for each capacitor in the first upper group of capacitors in the first array of capacitors, the calibration values representing capacitance value mismatches;

wherein the first predicting compute engine and the second predicting compute engine read calibration values generated by the calibration when computing the predicted-0 next compensation digital values and the predicted-1 next compensation digital values.

17. The pre-calculating compensated analog converter of claim 16 further comprising:

a first conversion compensation engine, activated by the calibration controller, for generating a first conversion compensation value for a most-significant-bit (MSB) to be converted;

wherein the first conversion compensation value is applied during a conversion cycle for the MSB as the compensation digital values to the plurality of second switches.

18. The pre-calculating compensated analog converter of claim 14 further comprising:

first calibration means for generating first calibration values for each capacitor in the first array of capacitors, the first calibration values applied to the second switches during a sampling phase to offset mismatches in capacitance values and switch noise;

second calibration means for generating second calibration values for each capacitor in the second array of capacitors, the second calibration values applied to the first switches during the sampling phase to offset mismatches in capacitance values and switch noise, whereby calibration values are generated and applied to offset mismatches.

\* \* \* \* \*